United States Patent
Youn et al.

(10) Patent No.: US 11,825,710 B2
(45) Date of Patent: Nov. 21, 2023

(54) DISPLAY DEVICE (71) Applicant: Samsung Display Co., LTD., Yongin-si (KR)

(72) Inventors: Il Goo Youn, Asan-si (KR); So Young Lee, Asan-si (KR); Seung Woo Sung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 336 days.

(21) Appl. No.: 17/348,203

(22) Filed: Jun. 15, 2021

(65) Prior Publication Data
US 2022/0140054 A1 May 5, 2022

(30) Foreign Application Priority Data
Nov. 2, 2020 (KR) .................. 10-2020-0144660

(51) Int. Cl.
H10K 59/131 (2023.01)
H10K 50/844 (2023.01)
H10K 59/123 (2023.01)

(52) U.S. Cl.
CPC ......... *H10K 59/131* (2023.02); *H10K 50/844* (2023.02); *H10K 59/123* (2023.02)

(58) Field of Classification Search
CPC ... H10K 59/131; H10K 59/123; H10K 50/844
USPC ........................................................ 257/40
See application file for complete search history.

(56) References Cited

U.S. PATENT DOCUMENTS

| 2020/0175917 | A1 | 6/2020 | Jo et al. |
| 2021/0376037 | A1* | 12/2021 | You .................... H10K 59/1315 |
| 2022/0059641 | A1 | 2/2022 | Na |
| 2022/0165817 | A1* | 5/2022 | Kim ...................... H10K 59/38 |
| 2023/0200159 | A1* | 6/2023 | Kang ................... H10K 59/131 257/40 |

FOREIGN PATENT DOCUMENTS

| KR | 10-2018-0025104 | 3/2018 |
| KR | 10-2019-0116595 | 10/2019 |
| KR | 10-2020-0008837 | 1/2020 |
| KR | 10-2022-0023891 | 3/2022 |

* cited by examiner

Primary Examiner — Xia L Cross
(74) Attorney, Agent, or Firm — KILE PARK REED & HOUTTEMAN PLLC (57) ABSTRACT A display device according to an embodiment includes a substrate including a display area, a first peripheral area disposed outside the display area, and a second peripheral area disposed between the display area and the first peripheral area; a common voltage supply line disposed on the first peripheral area and the second peripheral area of the substrate; and a common electrode electrically connected to the common voltage supply line, wherein the common voltage supply line includes a first opening disposed in the first peripheral area; and a second opening disposed in the second peripheral area, and the first opening and the second opening are different in size or arrangement.

21 Claims, 9 Drawing Sheets

DISPLAY DEVICE

CROSS-REFERENCE TO RELATED APPLICATION(S)

This application claims priority to and the benefit of Korean Patent Application No. 10-2020-0144660 under 35 U.S.C. § 119 filed in the Korean Intellectual Property Office (KIPO) on Nov. 2, 2020, the entire contents of which are incorporated herein by reference.

BACKGROUND

1. Technical Field

The disclosure relates to a display device.

2. Description of Related Art

A display device is a device that displays a screen, and includes a liquid crystal display (LCD), an organic light emitting diode (OLED), and the like. The display device is used in various electronic devices such as a mobile phone, a navigation device, a digital camera, an electronic book, a portable game machine, and various terminals.

Since the OLED display has a self-luminance characteristic and does not require a separate light source, unlike the LCD, a thickness and a weight thereof may be reduced. Further, since the OLED display has high-grade characteristics such as low power consumption, high luminance, and a high response speed, the OLED device receives attention as a next-generation display device.

The OLED display includes pixels including an organic light emitting diode as a self-emissive element, and transistors for driving the organic light emitting diode and at least one capacitor are formed in each pixel. The transistors generally includes a switching transistor and a driving transistor.

An insulating layer is positioned between these transistors and electrodes. The insulating layer may be made of an organic material, and a gas may be generated inside the insulating layer during a baking process of this organic material. The generated gas moves to the upper surface of the insulating layer and may not be discharged because it is shielded by the electrode positioned on the insulating layer. This gas affects the electrodes, the wiring, and the light-emitting elements positioned on the insulating layer, thereby there is a problem that defects are caused.

The above information disclosed in this Background section is only for enhancement of understanding of the background of the described technology, and therefore it may contain information that does not form the prior art that is already known in this country to a person of ordinary skill in the art.

SUMMARY

An embodiment is to provide a display device capable of preventing defects of the electrodes or the wiring, and the like.

A display device according to an embodiment may a substrate including a display area, a first peripheral area disposed outside the display area, and a second peripheral area disposed between the display area and the first peripheral area; a common voltage supply line disposed on the first peripheral area and the second peripheral area of the substrate; and a common electrode electrically connected to the common voltage supply line. The common voltage supply line may include at least one first opening disposed in the first peripheral area; and at least one second opening disposed in the second peripheral area, and the at least one first opening and the at least one second opening are different in size and/or arrangement.

The at least one first opening may include a plurality of first openings formed in a plurality of columns, and the at least one second opening may include a plurality of second openings formed in a zigzag shape.

A size of the at least one second opening may be larger than the size of the at least one first opening.

The plurality of columns may be separated in a first direction, and the plurality of first openings may be separated in a second direction in each of the plurality of columns.

The plurality of first openings may be separated by a first interval in the second direction, the plurality of first openings may be separated by a second interval in the first direction, and the second interval may be greater than the first interval.

The at least one first opening may have a square shape, and a length of a side of the at least one first opening may be greater than the first interval and less than the second interval.

The plurality of second openings may be disposed to be adjacent in a diagonal direction that is different from the first direction and the second direction.

The plurality of second openings may by separated in the diagonal direction by a third interval, and the third interval may be greater than the first interval and smaller than the second interval.

The at least one second opening may have a square shape, and a length of a side of the at least one second opening may be greater than the third interval.

A size of the at least one second opening may be larger than a size of the at least one first opening.

The at least one first opening and the at least one second opening may have one or more polygon shapes and/or one or more circle shapes.

The at least one first opening and the at least one second opening may have one or more square shapes, and a length of a side of the at least one second opening may be greater than a length of a side of the at least one first opening.

The display device according to an embodiment may further include a passivation layer disposed between the substrate and the common voltage supply line. The passivation layer may include an organic material.

The display device according to an embodiment may further include at least one dam, and a protection pattern. The at least one dam and the protection pattern may be disposed on the passivation layer and the common voltage supply line, the at least one dam may be disposed in the first peripheral area, and the protection pattern may be disposed in the second peripheral area.

The at least one dam may overlap the at least one first opening, the at least one dam may include a plurality of dams separated in a plurality of columns, and the protection pattern may overlap the at least one second opening and have a zigzag shape.

The at least one dam may overlap a side of the common voltage supply line within the at least one first opening, and the protection pattern may overlap a side of the common voltage supply line within the at least one second opening.

A display device according to an embodiment may further include a transistor disposed on a display area of a substrate; a pixel electrode electrically connected to the transistor; a partition wall disposed on the pixel electrode, the partition wall including a third opening; and a light-emitting element layer disposed within the third opening. The at least one dam and the protection pattern, and the partition wall may be disposed on a same layer, and the common voltage supply line and the pixel electrode may be disposed on a same layer.

The common electrode may be disposed on the at least one dam, the protection pattern, the partition wall, and the light-emitting element layer.

The display device according to an embodiment may further include an encapsulation layer disposed on the common electrode. The encapsulation layer may include a first encapsulation inorganic layer, an encapsulation organic layer, and a second encapsulation inorganic layer.

The substrate may further include a valley area disposed between the first peripheral area and the second peripheral area, the passivation layer may include a fourth opening disposed in the valley area, and a part of the passivation layer disposed in the first peripheral area and a part of the passivation disposed in the second peripheral area may be separated by the fourth opening.

The common voltage supply line may contact a side of the passivation layer within the fourth opening.

According to embodiments, characteristics of the electrode or wiring of the display device may be improved.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

In order to clearly explain the disclosure, portions that are not directly related to the disclosure are omitted, and the same reference numerals are attached to the same or similar constituent elements throughout the entire specification.

The size and thickness of each configuration shown in the drawings are arbitrarily shown for better understanding and ease of description, but the disclosure is not limited thereto. In the drawings, the thickness of layers, films, panels, areas, etc., may be exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Unless explicitly described to the contrary, the word "comprise," "include," and "have," and variations thereof will be understood to imply the inclusion of stated elements but not the exclusion of any other elements.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Further, in the specification, the word "on" or "above" means positioned on or below the object portion, and does not necessarily mean positioned on the upper side of the object portion based on a gravitational direction.

First, a description of a display device according to an embodiment is as follows with reference to FIG. 1.

Figure 1:
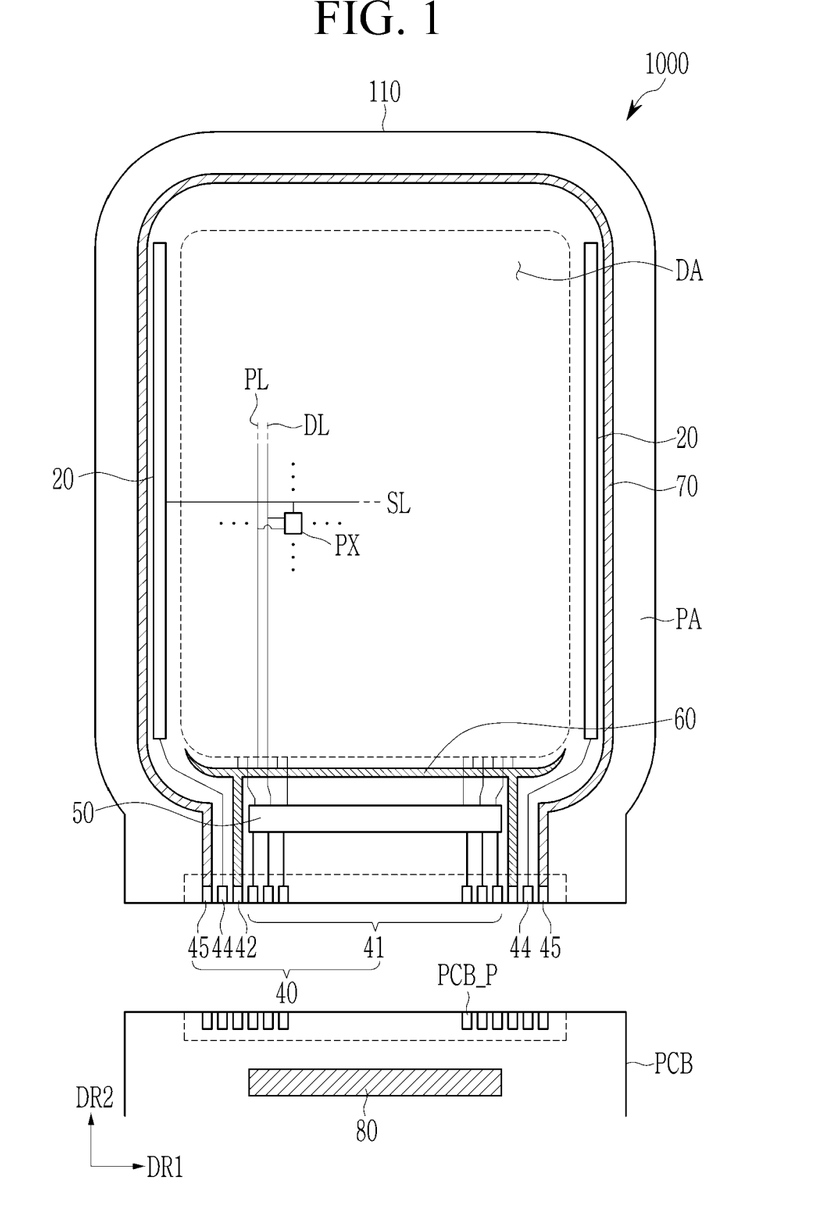
FIG. 1 is a schematic plan view of a display device according to an embodiment.

FIG. 1 is a schematic plan view of a display device according to an embodiment.

As shown in FIG. 1, a display device 1000 according to an embodiment may include a substrate 110 having a display area DA and a peripheral area PA.

The display area DA may be positioned in the center of the display device 1000 and may have a substantially rectangular shape, and each corner of the display area DA may have a rounded shape. The display area DA may be an area that displays an image.

Pixels PX may be positioned in the display area DA, and each pixel PX may be electrically connected to signal lines PL, DL, and SL. The pixels PX may be disposed in a matrix shape in a first direction DR1 and a second direction DR2 and may receive an image signal and display an image. The arrangement of pixels PX may be variously changed. Signal lines PL, DL, and SL may extend to intersect each other in the first direction DR1 or the second direction DR2. Each pixel PX may include transistors, capacitors, and at least one light-emitting element, which are electrically connected to signal lines. For example, the display device 1000 according to an embodiment may be formed as an organic light emitting device. However, the type of display device 1000 according to an embodiment is not limited thereto and may be formed of various types of display devices.

The peripheral area PA may be positioned outside the display area DA and surround the display area DA. The peripheral area PA may be an area in which no image is displayed, and may be positioned on the outer part of the display device.

A driving circuit unit may be positioned in the peripheral area PA, and the driving circuit unit may include driver and signal wires. As an example, the driving circuit unit may include a scan driver 20, a data driver 50, a driving voltage supply line 60, a common voltage supply line 70, and signal transmission wirings electrically connected to them.

The scan driver 20 may generate a scan signal and transmit it to each pixel PX through the scan line SL. A scan driver 20 may be disposed on the left and right sides of the display area, respectively. FIG. 1 illustrates a structure in which the scan driver 20 is disposed on both sides of the substrate 110, but the disclosure is not limited thereto, and the position of the scan driver 20 may be variously changed. For example, the scan driver 20 may be disposed on a side of the substrate 110.

A pad unit 40 may be disposed at a side of the substrate 110, and the pad unit 40 may include terminals 41, 42, 44, and 45. The pad unit 40 may be exposed without being covered or overlapped by an insulating layer and may be electrically connected to a printed circuit board PCB. The pad unit 40 may be electrically connected to a pad unit PCB_P of the printed circuit board PCB. The printed circuit board PCB may transmit a signal of an IC driving chip 80 or power to the pad unit 40.

Although not shown in the drawings, a controller may convert image signals, transmitted from the outside, into image data signals and may transmit the converted signals to the data driver 50 through the terminal 41. The controller may receive a vertical synchronization signal, a horizontal synchronization signal, and a clock signal to generate a control signal for controlling the driving of the scan driver 20 and the data driver 50 and may transmit the control signal to the scan driver 20 and the data driver 50 through the terminals 44 and 41. The controller may transmit a driving voltage ELVDD to the driving voltage supply line 60 through the terminal 42. The controller may deliver a common voltage ELVSS to the common voltage supply line 70 through the terminal 45.

The data driver 50 may be disposed in the peripheral area PA. The data driver 50 may generate a data signal and may transmit it to each pixel PX through the data line DL. The data driver 50 may be disposed on a side of a display panel. For example, the data driver 50 may be disposed between the pad unit 40 and the display area DA.

The driving voltage supply line 60 may be disposed on the peripheral area PA. For example, the driving voltage supply line 60 may be disposed between the data driver 50 and the display area DA. The driving voltage supply line 60 may transmit the driving voltage ELVDD to each pixel PX through the driving voltage line PL. The driving voltage supply line 60 may extend in the first direction DR1 and may be electrically connected to driving voltage lines PL extending in the second direction DR2.

The common voltage supply line 70 may be disposed on the peripheral area PA. The common voltage supply line 70 may surround the substrate 110. The common voltage supply line 70 may transmit a common voltage ELVSS to each pixel PX. The common voltage supply line 70 may be electrically connected to an electrode (e.g., a second electrode) of the light-emitting element and may transmit the common voltage ELVSS.

A display area of a display device according to an embodiment is described with reference to FIG. 2.

Figure 2:
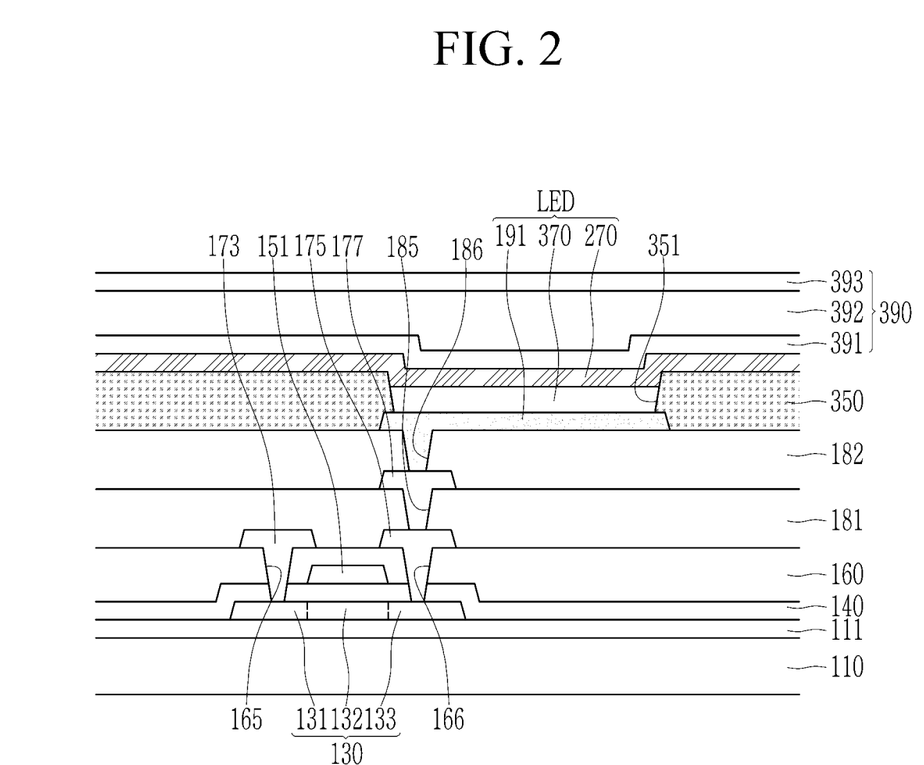
FIG. 2 is a schematic cross-sectional view showing a display area of a display device according to an embodiment.

FIG. 2 is a schematic cross-sectional view illustrating a display area of a display device according to an embodiment.

As shown in FIG. 2, the substrate 110 may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may include a flexible material capable of bending or folding and may be single-layered or multi-layered.

A buffer layer 111 may be positioned on the substrate 110. The buffer layer 111 may have a single-layered or multi-layered structure. The buffer layer 111 may include an inorganic insulating material or an organic insulating material such as a silicon nitride ($SiN_x$), a silicon oxide ($SiO_x$), and a silicon oxynitride ($SiO_xN_y$). The buffer layer 111 may be omitted in some embodiments. A barrier layer may be further positioned between the substrate 110 and the buffer layer 111. The barrier layer may have a single-layered or multi-layered structure. The barrier layer may include an inorganic insulating material such as a silicon nitride ($SiN_x$), a silicon oxide ($SiO_x$), and a silicon oxynitride ($SiO_xN_y$).

A semiconductor layer including a semiconductor 130 may be positioned on the buffer layer 111. The semiconductor 130 may include a first area 131, a channel 132, and a second area 133. The first area 131 and the second area 133 may be positioned on sides of the channel 132 of the semiconductor 130, respectively. The semiconductor 130 may include a semiconductor material such as amorphous silicon, a polysilicon, or an oxide semiconductor.

A gate insulating layer 140 may be positioned on the semiconductor 130. The gate insulating layer 140 may have a single-layered or multi-layered structure. The gate insulating layer 140 may include inorganic insulating materials such as a silicon nitride ($SiN_x$), a silicon oxide ($SiO_x$), and a silicon oxynitride ($SiO_xN_y$).

A gate conductive layer including a gate electrode 151 may be positioned on the gate insulating layer 140. The gate electrode 151 may overlap the channel 132 of the semiconductor 130. The gate conductive layer may have a single-layered or multi-layered structure. The gate conductive layer may include a metal such as molybdenum (Mo), aluminum (Al), copper (Cu), and/or titanium (Ti). After the gate conductive layer is formed, a doping process or plasma treatment may be performed. A part of the semiconductor layer that is covered or overlapped by the gate conductive layer is not doped or plasma-treated, and a part of the semiconductor layer that is not covered or overlapped by the gate conductive layer is doped or plasma-treated to have the same characteristics as a conductor.

An interlayer insulating layer 160 may be positioned on the gate electrode 151. The interlayer insulating layer 160 may have a single-layered or multi-layered structure. The interlayer insulating layer 160 may include an inorganic insulating material or an organic insulating material.

A first data conductive layer including a source electrode 173 and a drain electrode 175 may be positioned on the interlayer insulating layer 160. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The interlayer insulating layer 160 may include an opening 165 overlapping the source electrode 173 and the first area 131 of the semiconductor 130. The source electrode 173 may be electrically connected to the first area 131 of the semiconductor 130 through the opening 165. The interlayer insulating layer 160 may include an opening 166 overlapping the drain electrode 175 and the second area 133 of the semiconductor 130. The drain electrode 175 may be electrically connected to the second area 133 of the semiconductor 130 through the opening 166.

A first passivation layer 181 and a second passivation layer 182 may be sequentially positioned on the source electrode 173 and the drain electrode 175. The first passivation layer 181 and the second passivation layer 182 may include an organic insulating material such as a polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

A second data conductive layer including a connection electrode 177 may be disposed between the first passivation layer 181 and the second passivation layer 182. The first passivation layer 181 may include an opening 185 overlapping the connection electrode 177 and the drain electrode 175. The connection electrode 177 may be electrically connected to the drain electrode 175 through the opening 185.

The gate electrode 151, the semiconductor 130, the source electrode 173, and the drain electrode 175 may constitute a transistor, and the transistor may be electrically connected to a light-emitting element (or light-emitting diode) LED. The light-emitting element LED may include a pixel electrode 191, a light-emitting element layer 370, and a common electrode 270.

The pixel electrode 191 may be positioned on the second passivation layer 182. The second passivation layer 182 may include an opening 186 overlapping the pixel electrode 191 and the connection electrode 177. The pixel electrode 191 may be electrically connected to the connection electrode 177 through the opening 186. The connection electrode 177 may connect the drain electrode 175 and the pixel electrode 191. However, the disclosure is not limited thereto, and the drain electrode 175 and the pixel electrode 191 may be directly connected to each other without a connection electrode according to an embodiment.

A partition wall 350 may be positioned on the pixel electrode 191. A pixel opening 351 may be formed in the partition wall 350, and the pixel opening 351 of the partition wall 350 may overlap the pixel electrode 191. The partition wall 350 may include an organic insulating material such as a polymer such as polymethyl methacrylate (PMMA) or polystyrene (PS), a polymer derivative having a phenol-based group, an acryl-based polymer, an imide-based polymer, a polyimide, an acryl-based polymer, and a siloxane-based polymer.

The light-emitting element layer 370 may be positioned in the pixel opening 351 of the partition wall 350. The light-emitting element layer 370 may overlap the pixel electrode 191. The light-emitting element layer 370 may include an emission layer and an organic functional layer. The emission layer may include an organic material and/or an inorganic material. The organic functional layer may include a hole injection layer (HIL), a hole transporting layer (HTL), an electron transporting layer (ETL), and an electron injection layer (EIL). The light-emitting element layer 370 may generate a predetermined colored light.

The common electrode 270 may be positioned on the light-emitting element layer 370 and the partition wall 350. The common electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), and calcium (Ca), or a transparent conductive oxide (TCO) such as indium tin oxide (ITO) and indium zinc oxide (IZO).

The pixel electrode 191, the light-emitting element layer 370, and the common electrode 270 may form (or constitute) the light-emitting element LED, where the pixel electrode 191 may be an anode, which is a hole injection electrode, and the common electrode 270 may be a cathode, which is an electron injection electrode. However, the disclosure is not limited thereto, and the anode and the cathode may be reversed according to the driving method of the display device.

Holes and electrons may be injected into the light-emitting element layer 370 from the pixel electrode 191 and the common electrode 270, respectively, and light emission occurs in case that excitons in which the injected holes and electrons are bound to each other falls from an excited state to a ground state.

An encapsulation layer 390 may be positioned on the common electrode 270. The encapsulation layer 390 may overlap and seal the top surface of the light-emitting element LED and the side surfaces thereof. Since the light-emitting element LED is vulnerable to moisture and oxygen, the encapsulation layer 390 may seal the light-emitting element (LED) to block inflow of external moisture and oxygen.

The encapsulation layer 390 may include layers and may be formed of (or include) a composite film including both an inorganic layer and an organic layer, and for example, it may be formed as a triple layer in which a first encapsulation inorganic layer 391, an encapsulation organic layer 392, and a second encapsulation inorganic layer 393 are sequentially formed.

The first encapsulation inorganic layer 391 may overlap the common electrode 270. The first encapsulation inorganic layer 391 may prevent external moisture or oxygen from penetrating into the light-emitting element LED. For example, the first encapsulation inorganic layer 391 may include a silicon nitride, a silicon oxide, or a combination thereof. The first encapsulation inorganic layer 391 may be formed by a deposition process.

The encapsulation organic layer 392 may be disposed on the first encapsulation inorganic layer 391 and may contact the first encapsulation inorganic layer 391. A curvature formed on the top surface of the first encapsulation inorganic layer 391 or particles present on the first encapsulation inorganic layer 391 may be overlapped by the encapsulation organic layer 392, so that it is possible to block the surface state of the top surface of the first encapsulation inorganic layer 391 from affecting the components formed on the encapsulation organic layer 392. The encapsulation organic layer 392 may alleviate stress between the contacting layers. The encapsulation organic layer 392 may include an organic material and may be formed by a solution process such as spin coating, slit coating, or an inkjet process.

The second encapsulation inorganic layer 393 may be disposed on the encapsulation organic layer 392 to overlap the encapsulation organic layer 392. The second encapsulation inorganic layer 393 may be stably formed on a relatively flat surface rather than being disposed directly on the first encapsulation inorganic layer 391. The second encapsulation inorganic layer 393 may encapsulate moisture emitted from the encapsulation organic layer 392 and may prevent outflow to the outside. The second encapsulation inorganic layer 393 may include a silicon nitride, a silicon oxide, or a combination thereof. The second encapsulation inorganic layer 393 may be formed by a deposition process.

Although not shown, a capping layer may be further positioned between the common electrode 270 and the encapsulation layer 390. The capping layer may include an organic material. The capping layer may protect the common electrode 270 from a subsequent process, for example a sputtering process, and may improve light emission efficiency of the light-emitting element LED. The capping layer may have a refractive index of greater than that of the first encapsulation inorganic layer 391.

FIG. 2 illustrates a transistor among the transistors included in a pixel PX and the light-emitting element LED, but each pixel PX may include transistors. In the following, an example of transistors included in each pixel PX is described with reference to FIG. 3.

Figure 3:
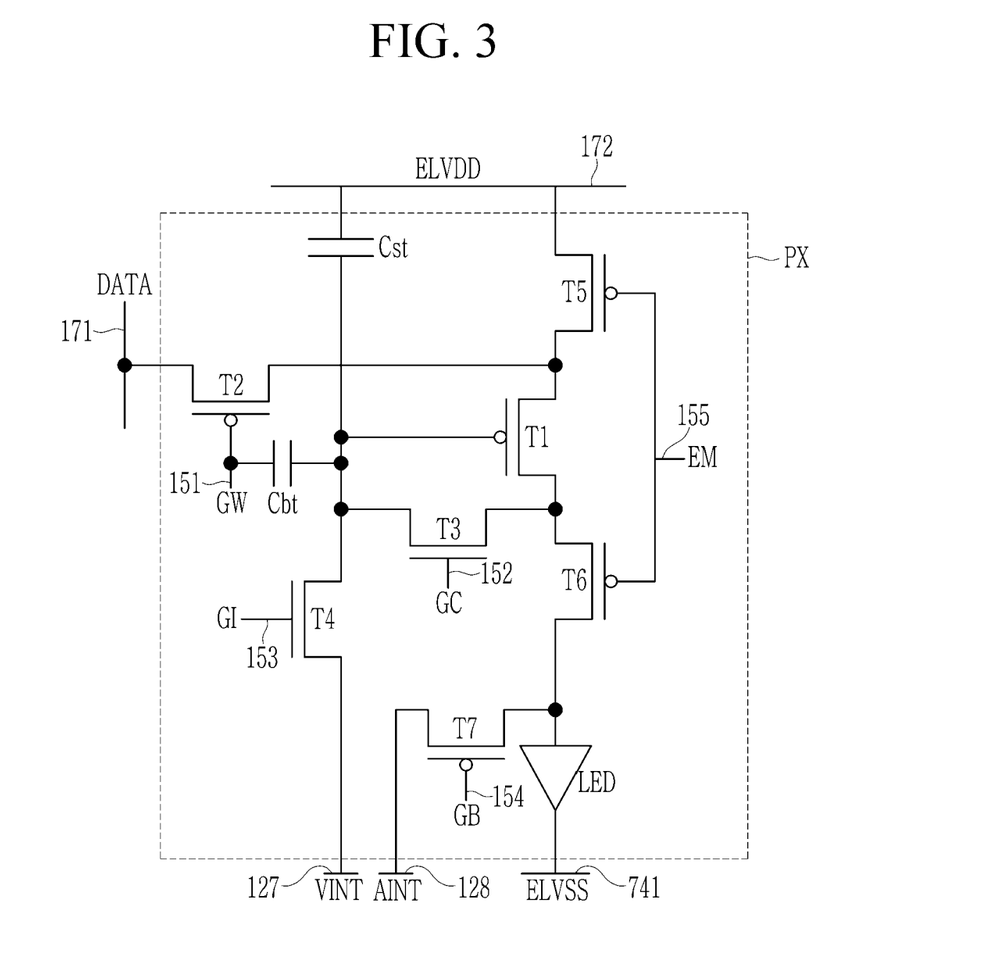
FIG. 3 is a schematic circuit diagram of a pixel of a display device according to an embodiment.

FIG. 3 is a schematic circuit diagram of a pixel of a display device according to an embodiment.

As shown in FIG. 3, a pixel PX of a display device according to an embodiment may include transistors T1, T2, T3, T4, T5, T6, and T7, a storage capacitor Cst, a boost capacitor Cbt, and a light-emitting element LED, which are electrically connected to several wirings 127, 128, 151, 152, 153, 154, 155, 171, 172, and 741.

The wirings 127, 128, 151, 152, 153, 154, 155, 171, 172, and 741 may be electrically connected to a pixel PX. The wirings 127, 128, 151, 152, 153, 154, 155, 171, 172, and 741 may include a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 may be electrically connected to the scan driver 20 (see FIG. 1) and may transmit a first scan signal GW to the second transistor T2. A voltage of an opposite polarity to a voltage applied to the first scan signal line 151 may be applied to the second scan signal line 152 with the same timing as the signal of the first scan signal line 151. For example, in case that a negative voltage may be applied to the first scan signal line 151, a positive voltage may be applied to the second scan signal line 152. The second scan signal line 152 may transmit a second scan signal GC to the third transistor T3.

The initialization control line 153 may transmit an initialization control signal GI to the fourth transistor T4. The bypass control line 154 may transmit a bypass signal GB to the seventh transistor T7. The bypass control line 154 may be formed as the first scan signal line 151 in front thereof. The light emission control line 155 may transmit a light emission control signal EM to the fifth transistor T5 and the sixth transistor T6.

The data line 171 may be a wire that transmits data voltage DATA generated by the data driver 50 (see FIG. 1), and the luminance of the light-emitting element LED may vary according to the data voltage DATA applied to the pixel PX.

The driving voltage line 172 may apply a driving voltage ELVDD. The first initialization voltage line 127 may transmit a first initialization voltage VINT, and the second initialization voltage line 128 may transmit a second initialization voltage AINT. The common voltage line 741 may apply the common voltage ELVSS to the cathode of the light-emitting element LED. In the embodiment, the voltages applied to the driving voltage line 172, the first and second initialization voltage lines 127 and 128, and the common voltage line 741 may be predetermined voltages, respectively.

Hereinafter, the structure of transistors and their connection relationships are further described.

The driving transistor T1 may have a p-type transistor characteristic and may include a polycrystalline semiconductor. The driving transistor T1 may be a transistor that controls the magnitude of the current output to the anode of the light-emitting element LED according to the data voltage DATA applied to a gate electrode of the driving transistor T1. Since the brightness of the light-emitting element LED is adjusted according to the magnitude of the driving current output to the anode of the light-emitting element LED, the luminance of the light-emitting element LED may be adjusted according to the data voltage DATA applied to the pixel PX. For this purpose, a first electrode of the driving transistor T1 may be disposed to receive the driving voltage ELVDD and may be electrically connected to the driving voltage line 172 via the fifth transistor T5. The first electrode of the driving transistor T1 may be electrically connected to a second electrode of the second transistor T2, so that the data voltage DATA is also applied thereto. A second electrode of the driving transistor T1 may be disposed to output the current toward the light emitting element LED and may be electrically connected to the anode of the light emitting element LED via the sixth transistor T6. The second electrode of the driving transistor T1 may transmit the data voltage DATA applied to the first electrode to the third transistor T3. The gate electrode of the driving transistor T1 may be electrically connected to an electrode of the storage capacitor Cst (hereinafter referred to as a "a second storage electrode"). Accordingly, the voltage of the gate electrode of the driving transistor T1 may vary according to the voltage stored in the storage capacitor Cst, and the driving current output by the driving transistor T1 may vary. The storage capacitor Cst may keep the voltage of the gate electrode of the driving transistor T1 constant for a frame.

The second transistor T2 may have a p-type transistor characteristic and may include a polycrystalline semiconductor. The second transistor T2 may be a transistor that receives the data voltage DATA into the pixel PX. A gate electrode of the second transistor T2 may be electrically connected to the first scan signal line 151 and an electrode of the boost capacitor Cbt (hereinafter referred to as a "lower boost electrode"). A first electrode of the second transistor T2 may be electrically connected to the data line 171. The second electrode of the second transistor T2 may be electrically connected to the first electrode of the driving transistor T1. In case that the second transistor T2 is turned on by a negative voltage of the first scan signal GW transmitted through the first scan signal line 151, the data voltage DATA transmitted through the data line 171 may be transmitted to the first electrode of the driving transistor T1.

The third transistor T3 may have an n-type transistor characteristic and may include an oxide semiconductor. The third transistor T3 may be electrically connected to the second electrode of the driving transistor T1 and the gate electrode of the driving transistor T1. As a result, the third transistor T3 may be a transistor that transmits a compensation voltage, which is a voltage changed from the data voltage DATA through the driving transistor T1, to a second storage electrode of the storage capacitor Cst. A gate electrode of the third transistor T3 may be electrically connected to the second scan signal line 152, and a first electrode of the third transistor T3 may be electrically connected to the second electrode of the driving transistor T1. A second electrode of the third transistor T3 may be electrically connected to the second storage electrode of the storage capacitor Cst, the gate electrode of the driving transistor T1, and another electrode (hereinafter referred to as an "upper boost electrode") of the boost capacitor Cbt. The third transistor T3 may be turned on by a positive voltage of the second scan signal GC transmitted through the second scan signal line 152, so that the gate electrode of the driving transistor T1 and the second electrode of the driving transistor T1 are electrically connected and the voltage applied to the gate electrode of the driving transistor T1 is transmitted to the second storage electrode of the storage capacitor Cst to be stored in the storage capacitor Cst.

The fourth transistor T4 may have an n-type transistor characteristic and may include an oxide semiconductor. The fourth transistor T4 may initialize the gate electrode of the driving transistor T1 and the second storage electrode of the storage capacitor Cst. The gate electrode of fourth transistor T4 may be electrically connected to the initialization control line 153, and a first electrode of the fourth transistor T4 may be electrically connected to the first initialization voltage line 127. A second electrode of the fourth transistor T4 may be electrically connected to the second storage electrode of the storage capacitor Cst, the gate electrode of the driving transistor T1, and an upper boost electrode via the second electrode of the third transistor T3. The fourth transistor T4 may be turned on by a positive voltage of the initialization control signal GI transmitted through the initialization control line 153, and the first initialization voltage VINT may be transmitted to the gate electrode of the driving transistor T1 and the second storage electrode of the storage capacitor Cst. Accordingly, the voltage of the gate electrode of the driving transistor T1 and the storage capacitor Cst may be initialized, The fifth transistor T5 may have p-type transistor characteristics and may include a polycrystalline semiconductor. The fifth transistor T5 may transmit the driving voltage ELVDD to the driving transistor T1. A gate electrode of the fifth transistor T5 may be electrically connected to the light emission control line 155, a first electrode of the fifth transistor T5 is electrically connected to the driving voltage line 172, and a second electrode of the fifth transistor T5 may be electrically connected to the first electrode of the driving transistor T1.

The sixth transistor T6 may have p-type transistor characteristics and may include a polycrystalline semiconductor. The sixth transistor T6 may transmit the driving current output from the driving transistor T1 to the light-emitting element LED. A gate electrode of the sixth transistor T6 may be electrically connected to the light emission control line 155, a first electrode of the sixth transistor T6 may be electrically connected to the second electrode of the driving transistor T1, and a second electrode of the sixth transistor T6 may be electrically connected to the anode of the light-emitting element LED.

The seventh transistor T7 may have p-type transistor characteristics and may include a polycrystalline semiconductor. The seventh transistor T7 may serve to initialize the anode of the light-emitting element LED. The gate electrode of the seventh transistor T7 may be electrically connected to the bypass control line 154, a first electrode of the seventh transistor T7 may be electrically connected to the anode of the light-emitting element LED, and a second electrode of the seventh transistor T7 may be electrically connected to the second initialization voltage line 128. If the seventh transistor T7 is turned on by a negative voltage of the bypass signal GB, the second initialization voltage AINT may be applied to the anode of the light-emitting element LED to be initialized.

In the above, it has been described that a pixel PX includes seven transistors T1 to T7, a storage capacitor Cst, and a boost capacitor Cbt, but the disclosure is not limited thereto, and the numbers of transistors and capacitors and their connection relationships may be changed in various ways.

In the embodiment, the driving transistor T1 may include a polycrystalline semiconductor. The third transistor T3 and the fourth transistor T4 may include an oxide semiconductor. The second transistor T2, the fifth transistor T5, the sixth transistor T6, and the seventh transistor T7 may include a polycrystalline semiconductor. However, the disclosure is not limited thereto, and at least one of the second transistor T2, the fifth transistor T5, the sixth transistor T6, and the seventh transistor T7 may include an oxide semiconductor. Transistors may all include a polycrystalline semiconductor.

Hereinafter, a peripheral area of a display device according to an embodiment is described with reference to FIGS. 4 to 7.

Figure 4:
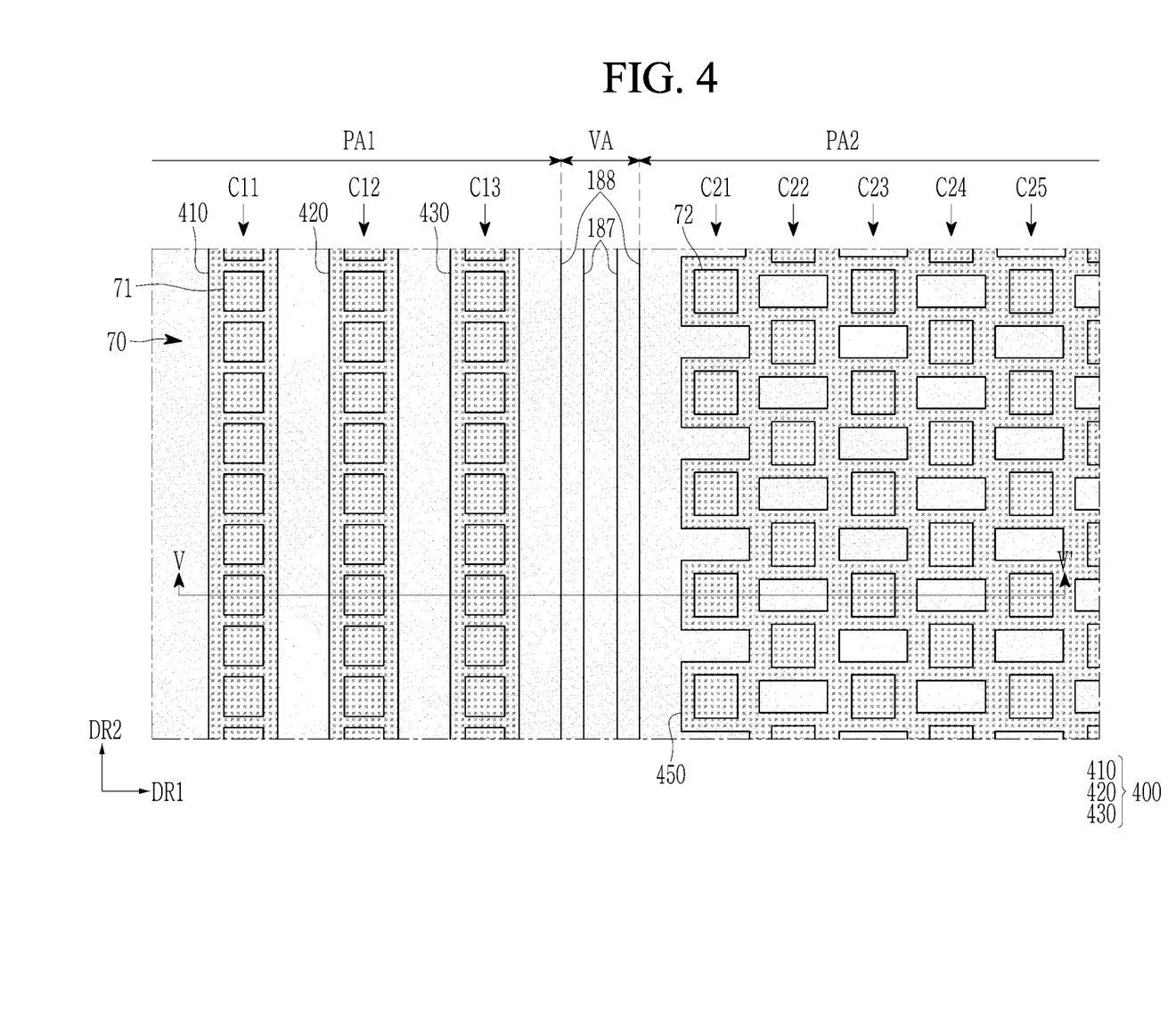
FIG. 4 is a schematic plan view showing a peripheral area of a display device according to an embodiment.
Figure 5:
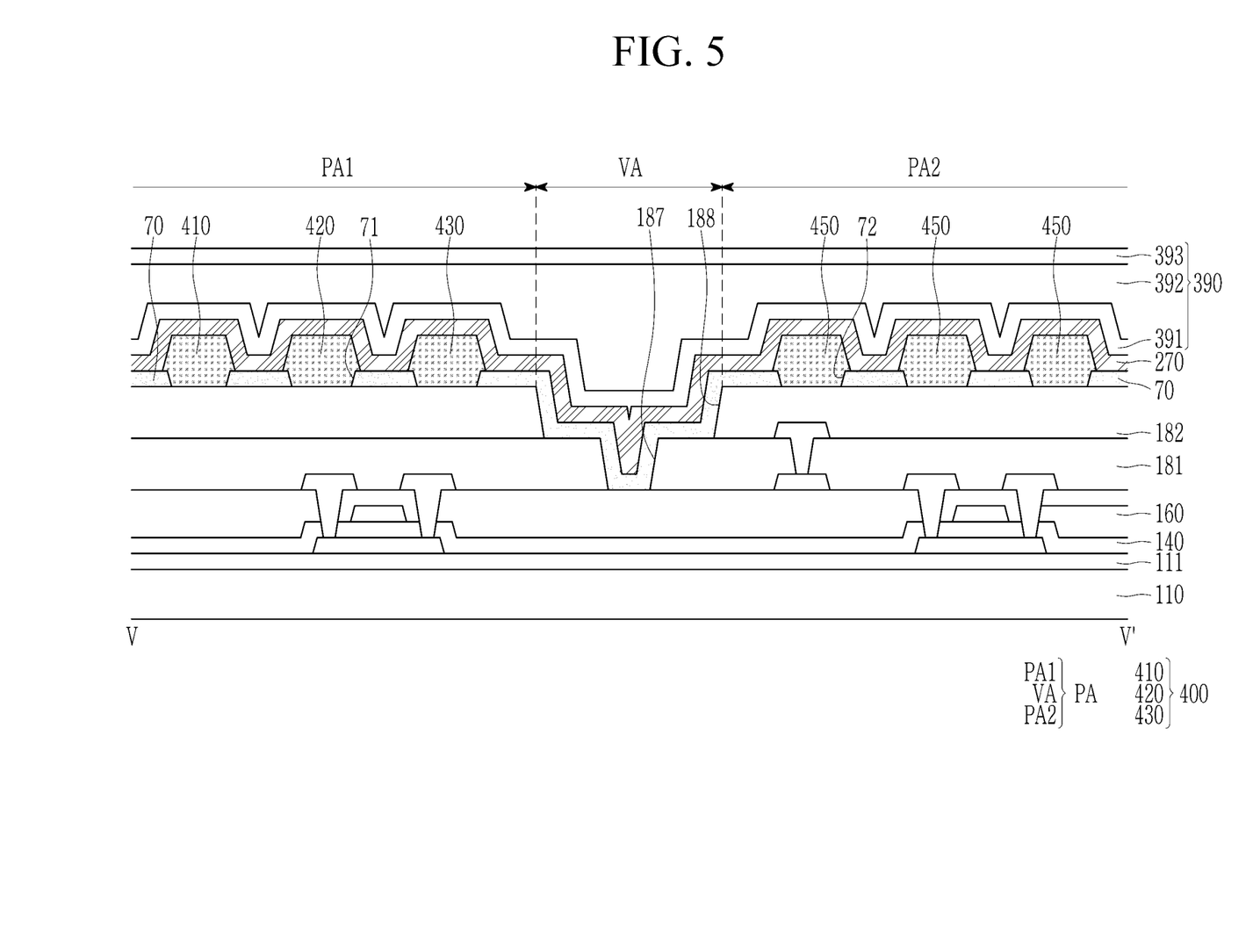
FIG. 5 is a schematic cross-sectional view taken along a line V-V' of FIG. 4.
Figure 6:
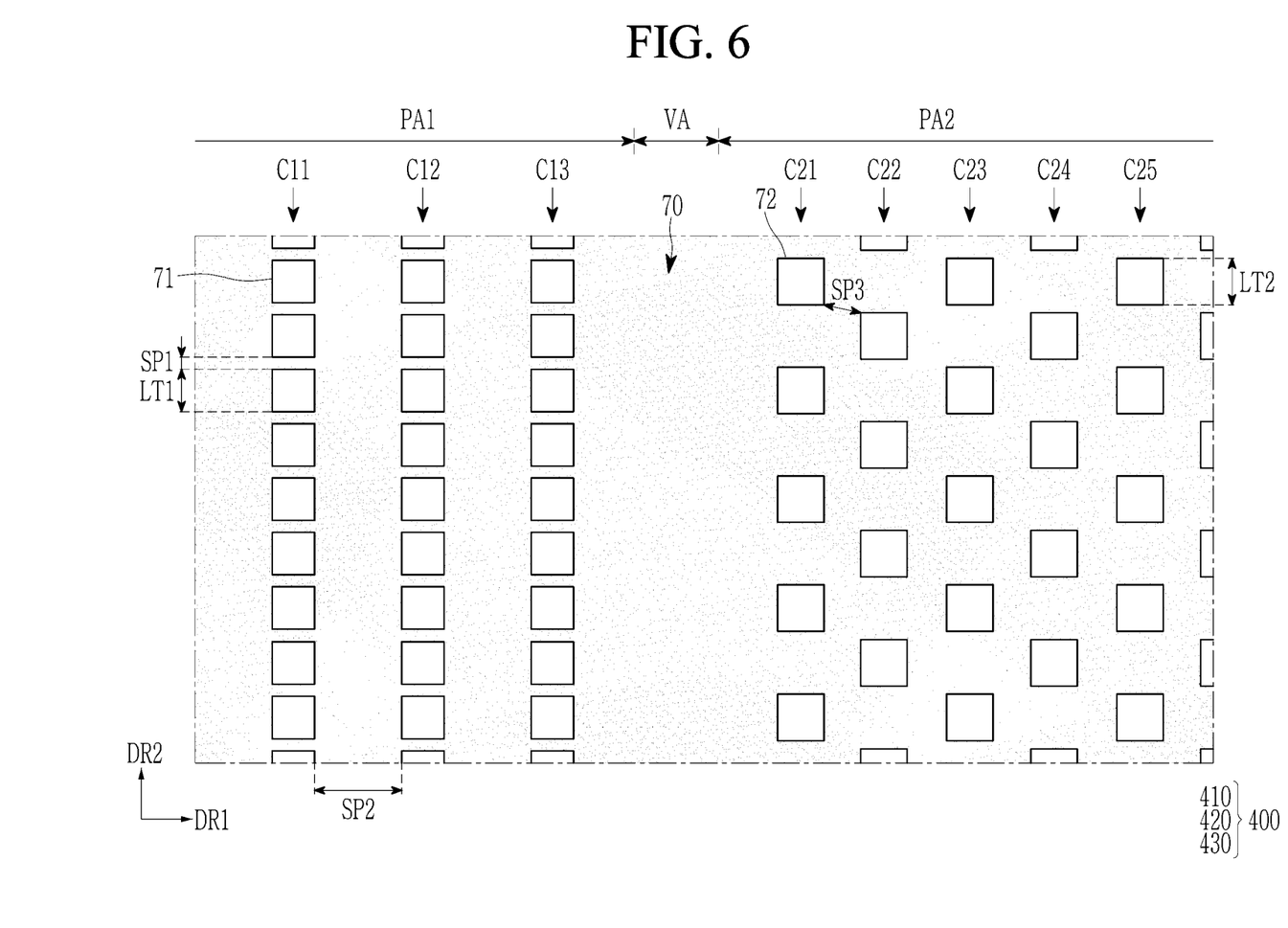
FIG. 6 and FIG. 7 are schematic plan views showing some layers of a peripheral area of a display device according to an embodiment.
Figure 7:
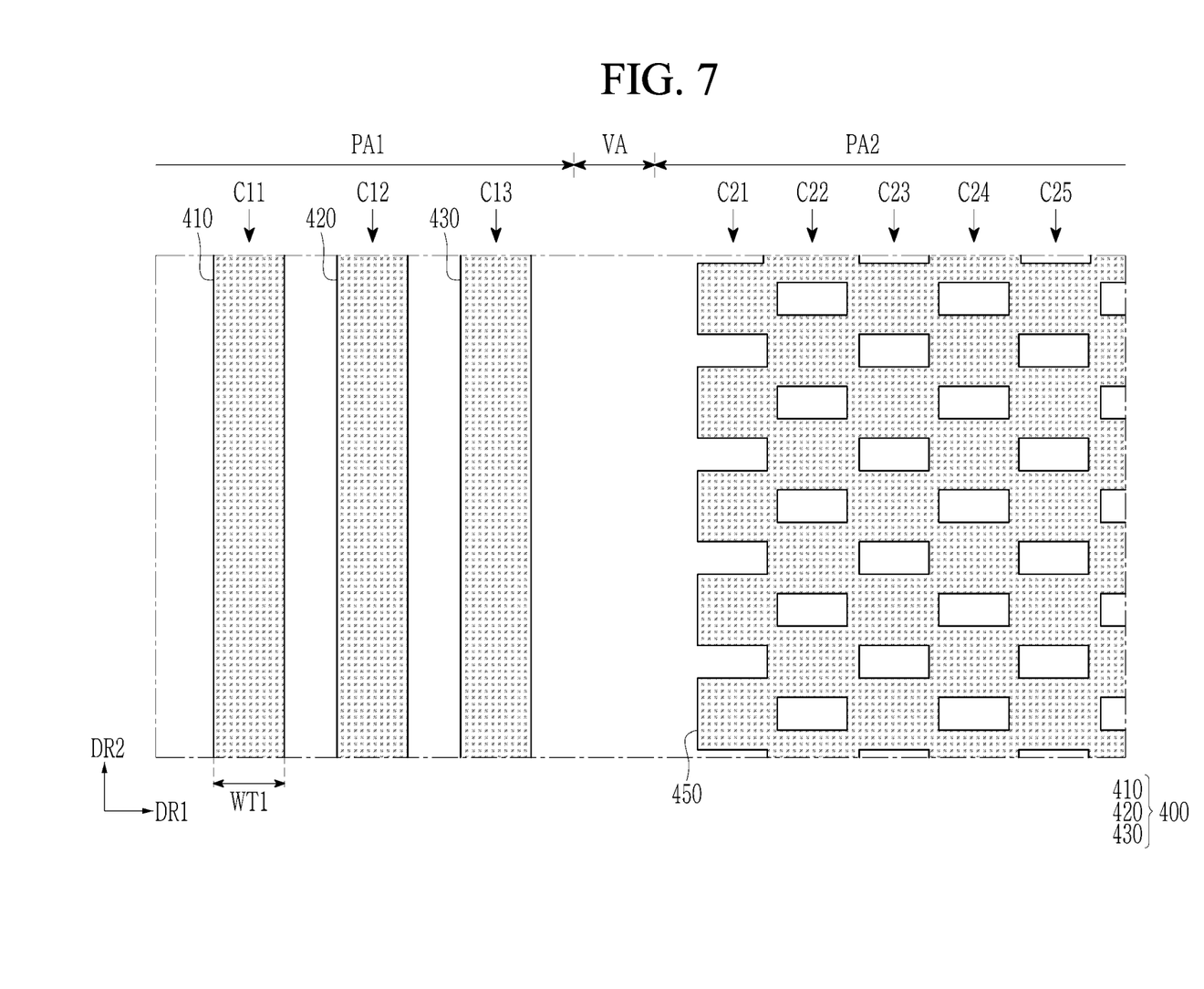

FIG. 4 is a schematic plan view illustrating a peripheral area of a display device according to an embodiment, FIG. 5 is a schematic cross-sectional view taken along line V-V' of FIG. 4, and FIGS. 6 and 7 are schematic plan views illustrating some layers of a peripheral area of a display device according to an embodiment. FIG. 6 illustrates a common voltage supply line of a display device according to an embodiment, and FIG. 7 illustrates a dam and a protection pattern of a display device according to an embodiment.

As shown in FIGS. 4 to 7, in a display device according to an embodiment, in the peripheral area PA of the substrate 110 as in the display area, a buffer layer 111, a gate insulating layer 140, an interlayer insulating layer 160, a first passivation layer 181, and a second passivation layer 182 may be sequentially stacked.

A driving circuit unit may be positioned in the peripheral area PA of the substrate 110. The configuration of the driving circuit unit may be changed in various ways, and specific illustrations thereof are omitted. The driving circuit unit may include conductors positioned in different layers distinguished by the buffer layer 111, the gate insulating layer 140, the interlayer insulating layer 160, the first passivation layer 181, the second passivation layer 182, or the like. For example, the driving circuit unit may be composed of electrodes positioned in a gate metal layer, the first data conductive layer, the second data conductive layer, or the like.

The common voltage supply line 70 may be positioned on the second passivation layer 182. The common voltage supply line 70 may overlap the driving circuit unit.

For example, the common voltage supply line 70 may overlap the scan driver 20 (see FIG. 1) of the driving circuit unit. FIGS. 4 and 5 illustrate a part of the peripheral area PA disposed on the left side of the display area DA in FIG. 2. Therefore, the display area DA may be positioned on the right side of the common voltage supply line 70 shown in FIG. 4, and an illustration thereof is omitted.

The peripheral area PA may include a first peripheral area PA1, a second peripheral area PA2, and a valley area VA. The first peripheral area PA1 may be an area positioned at the edge of the peripheral area PA. The second peripheral area PA2 may be an area positioned between the first peripheral area PA1 and the display area DA. The valley area VA may be an area positioned between the first peripheral area PA1 and the second peripheral area PA2. For example, the peripheral area PA may be disposed in an order of the second peripheral area PA2, the valley area VA, and the first peripheral area PA1 from the display area DA.

The common voltage supply line 70 may be disposed in the first peripheral area PA1, the valley area VA, and the second peripheral area PA2. The common voltage supply line 70 and the pixel electrode 191 may be positioned on a same layer. The common voltage supply line 70 and the pixel electrode 191 may be formed by a same process.

The common voltage supply line 70 may include first openings 71 positioned in the first peripheral area PA1 and second openings 72 positioned in the second peripheral area PA2. The first opening 71 and the second opening 72 may be areas where the common voltage supply line 70 is removed, and may mean areas where the second passivation layer 182 is not overlapped by the common voltage supply line 70. The planar shape of the first opening 71 and the second opening 72 may be square. However, the planar shape of the first opening 71 and the second opening 72 is not limited thereto and may be variously changed. For example, the first opening 71 and the second opening 72 may be formed in the shape of a polygon such as a rectangle, a pentagon, an octagon, or a circle.

The first opening 71 and the second opening 72 of the common voltage supply line 70 may have different sizes and different arrangements.

The first openings 71 may be disposed in a direction. For example, the first openings 71 may be positioned in three columns C11, C12, and C13 in the second direction DR2. First openings 71 may be positioned in the first column C11, the second column C12, and the third column C13. The first openings 71 positioned in each column C11, C12, and C13 may be spaced apart from each other by a first interval SP1. The first column C11 and the second column C12 may be separated from each other by a second interval SP2. The second column C12 and the third column C13 may be separated from each other by a second interval SP2. The second interval SP2 may be greater than the first interval SP1. For example, first openings 71 may be densely disposed in the second direction DR2 and be sparsely disposed in the first direction DR1. The first openings 71 positioned in the different columns C11, C12, and C13 may be positioned on a straight line in the first direction DR1 perpendicular to the second direction DR2.

The first openings 71 may have a square shape, and a length LT1 of a side of the first opening 71 may be about 16 μm. However, this is only an example, and the shape of the first opening 71 and the length LT1 of a side may be variously changed and designed. The first interval SP1 may be smaller than the length LT1 of a side of the first opening 71, and the second interval SP2 may be greater than the length LT1 of a side of the first opening 71.

The second openings 72 may be disposed in a zigzag shape. For example, the second openings 72 may be positioned in five columns C21, C22, C23, C24, and C25 in the second direction DR2. Second openings 72 may be positioned in the first column C21, and second openings 72 may be positioned in the second column C22. The second openings 72 positioned on the first column C21 and the second openings 72 positioned on the second column C22 may be adjacent to each other in a diagonal direction that is different from the first direction DR1 and the second direction DR2. The second openings 72 positioned on the first column C21 and the second openings 72 positioned on the second column C22 may be separated by a third interval SP3. The third interval SP3 may be greater than the first interval SP1 and may be smaller than the second interval SP2.

The second openings 72 may have a square shape, and a length LT2 of a side of the second openings 72 may be about 18 μm. However, this is only an example, and the shape of the second openings 72 and the length LT2 of a side may be variously changed and designed. The length LT2 of a side of the second openings 72 may be greater than the length LT1 of the side of the first openings 71. The third interval SP3 may be smaller than the length LT2 of the side of the second opening 72.

For example, the first opening 71 may be disposed at low density in the first direction DR1 and at high density in the second direction DR2, and the second opening 72 may be disposed at uniform density overall in the second peripheral area PA2. The first opening 71 may be disposed in columns, and the second opening 72 may be disposed in a zigzag shape. The first opening 71 may have a smaller size than the second opening 72.

In the valley area VA positioned between the first peripheral area PA1 and the second peripheral area PA2, the first passivation layer 181 may include an opening 187, and the second passivation layer 182 may include an opening 188. The opening 187 of the first passivation layer 181 and the opening 188 of the second passivation layer 182 may overlap each other. The opening 187 of the first passivation layer 181 may be positioned in the middle of the valley area VA. The opening 188 of the second passivation layer 182 may have a wider width than the opening 187 of the first passivation layer 181. The opening 187 of the first passivation layer 181 and the opening 188 of the second passivation layer 182 may extend in a direction in a plane. For example, the opening 187 of the first passivation layer 181 and the opening 188 of the second passivation layer 182 may extend in the second direction DR2. A portion of the first passivation layer 181 positioned in the first peripheral area PA1 and a portion of the first passivation layer 181 positioned in the second peripheral area PA2 may not be electrically connected to each other and may be separated by the opening 187 of the first passivation layer 181. A portion of the second passivation layer 182 positioned in the first peripheral area PA1 and a portion of the second passivation layer 182 positioned in the second peripheral area PA2 may not be electrically connected to each other and may be separated by the opening 188 of the second passivation layer 182.

The common voltage supply line 70 may be positioned within the opening 187 of the first passivation layer 181 and within the opening 188 of the second passivation layer 182. The common voltage supply line 70 may contact the upper surface of the interlayer insulating layer 160 and the side surface of the first passivation layer 181 within the opening 187 of the first passivation layer 181. The common voltage supply line 70 may contact the upper surface of the first passivation layer 181 and the side surface of the second passivation layer 182 within the opening 188 of the second passivation layer 182.

The first passivation layer 181 and the second passivation layer 182 may be made of an organic material, and a gas may be generated as the organic material is cured during a baking process. This gas may not be discharged because it is shielded by the common voltage supply line 70 positioned above the first passivation layer 181 and the second passivation layer 182. In the display device according to an embodiment, the opening 187 of the first passivation layer 181 and the opening 188 of the second passivation layer 182 may prevent the gas generated in the first peripheral area PA1 from moving to the second peripheral area PA2 and the display area DA. Therefore, by preventing the gas generated in the first peripheral area PA1 from affecting the second peripheral area PA2 and the display area DA, it is possible to improve the characteristics of the device positioned on the second passivation layer 182.

Since the first opening 71 is formed in the common voltage supply line 70 disposed in the first peripheral area PA1, the gas generated in the first peripheral area PA1 may be discharged through the first opening 71, thereby improving the characteristic of the element disposed on the second passivation layer 182.

Since the second opening 72 is formed in the common voltage supply line 70 located in the second peripheral area PA2, the gas generated in the second peripheral area PA2 may be discharged through the second opening 72, and the characteristic of the device positioned on the second passivation layer 182 may be improved.

A dam 400 and protection patterns 450 may be positioned on the second passivation layer 182 and the common voltage supply line 70. The dam 400 and the protection pattern 450 and the partition wall 350 may be positioned on a same layer. The dam 400 and the protection pattern 450 and the partition wall 350 may be formed by a same process.

The dam 400 may be positioned in the first peripheral area PA1. The dam 400 may be disposed in a direction. For example, the dam 400 can be positioned in the second direction DR2. The dam 400 may include a first dam 410, a second dam 420, and a third dam 430. The first dam 410, the second dam 420, and the third dam 430 may have a predetermined constant width WT1. However, the disclosure is not limited thereto, and the first dam 410, the second dam 420, and the third dam 430 may have different widths. The first dam 410 and the second dam 420 may be separated from each other by a predetermined interval, and the second dam 420 and the third dam 430 may be separated from each other by a predetermined interval. The distance between the first dam 410 and the second dam 420 and the distance between the second dam 420 and the third dam 430 may be equal to or different from each other. In the above, it is described that three dams 400 are positioned in the first peripheral area PA1, but the disclosure is not limited thereto. The number of the dams 400 positioned in the first peripheral area PA1 may be less than 3 or more than 3. For example, two dams 400 or four dams 400 may be positioned in the first peripheral area PA1.

The dam 400 may overlap the first opening 71 of the common voltage supply line 70. Therefore, the planar shape of the dam 400 may be similar to the arrangement of the first opening 71 in a plan view. The first dam 410 may be formed to overlap the first openings 71 positioned in the first column C11. The second dam 420 may be formed to overlap the first openings 71 positioned in the second column C12. The third dam 430 may be formed to overlap the first openings 71 positioned in the third column C13.

The dam 400 may be formed to overlap the common voltage supply line 70, which is positioned around the first opening 71, as well as the first opening 71 of the common voltage supply line 70. For example, the dam 400 may be formed to overlap the side of the common voltage supply line 70 within the first opening 71. Therefore, the side of the common voltage supply line 70 exposed by the first opening 71 may be protected by the dam 400. The width WT1 of the dam 400 may be greater than the length LT1 of a side of the first opening 71.

The protection pattern 450 may be positioned in the second peripheral area PA2. The protection pattern 450 may have a zigzag shape. The protection pattern 450 may have a shape such that it is interconnected in a diagonal direction. The protection pattern 450 located in the second peripheral area PA2 may be electrically connected as a whole.

The protection pattern 450 may overlap the second opening 72 of the common voltage supply line 70. Therefore, the planar shape of the protection pattern 450 may be similar to the arrangement of the second opening 72 in a plan view. The protection pattern 450 may be formed to overlap the second opening 72 positioned in the first column C21, the second opening 72 positioned in the second column C22, and a path adjacent thereto in a diagonal direction. The area between second openings 72 positioned in the first column C21 may not be overlapped by the protection pattern 450. The area between second openings 72 positioned in the second column C22 may not be overlapped by the protection pattern 450.

The protection pattern 450 may be formed to overlap the common voltage supply line 70 positioned around the second opening 72 as well as the second opening 72 of the common voltage supply line 70. For example, the protection pattern 450 may be formed to overlap the side of the common voltage supply line 70 within the second opening 72. Therefore, the side of the common voltage supply line 70 exposed by the second opening 72 may be protected by the protection pattern 450.

Above the common voltage supply line 70, the dam 400, and the protection pattern 450, a common electrode 270 may be positioned. The common electrode 270 may be electrically connected to the common voltage supply line 70. The common electrode 270 may receive the common voltage ELVSS through the common voltage supply line 70. The common electrode 270 may be positioned in most areas of the substrate 110.

On the common electrode 270, the encapsulation layer 390 may be positioned as in the display area DA. The encapsulation layer 390 may include a first encapsulation inorganic layer 391, an encapsulation organic layer 392, and a second encapsulation inorganic layer 393. The encapsulation organic layer 392 may be formed by curing a liquid organic material, and the liquid organic material should be controlled. In the embodiment, the protection pattern 450 may be formed in the entire second peripheral area PA2 adjacent to the display area DA, so that the liquid organic material may be spread evenly. In the first peripheral area PA1, dams 400 may extend side by side in a direction, so that the liquid organic material passes through the second peripheral area PA2 and may be blocked in the first peripheral area PA1. Therefore, it is possible to prevent the liquid organic material from reaching the edge of the substrate 110. FIG. 4 illustrates that the dam 400 is formed in a direction, but this indicates a partial area of the display device, for example, a left edge area of the display device, and is only a part of the dam 400 shown. Regarding the entire area of the display device, the dam 400 may surround the display area DA along the edge of the display device.

Figure 8:
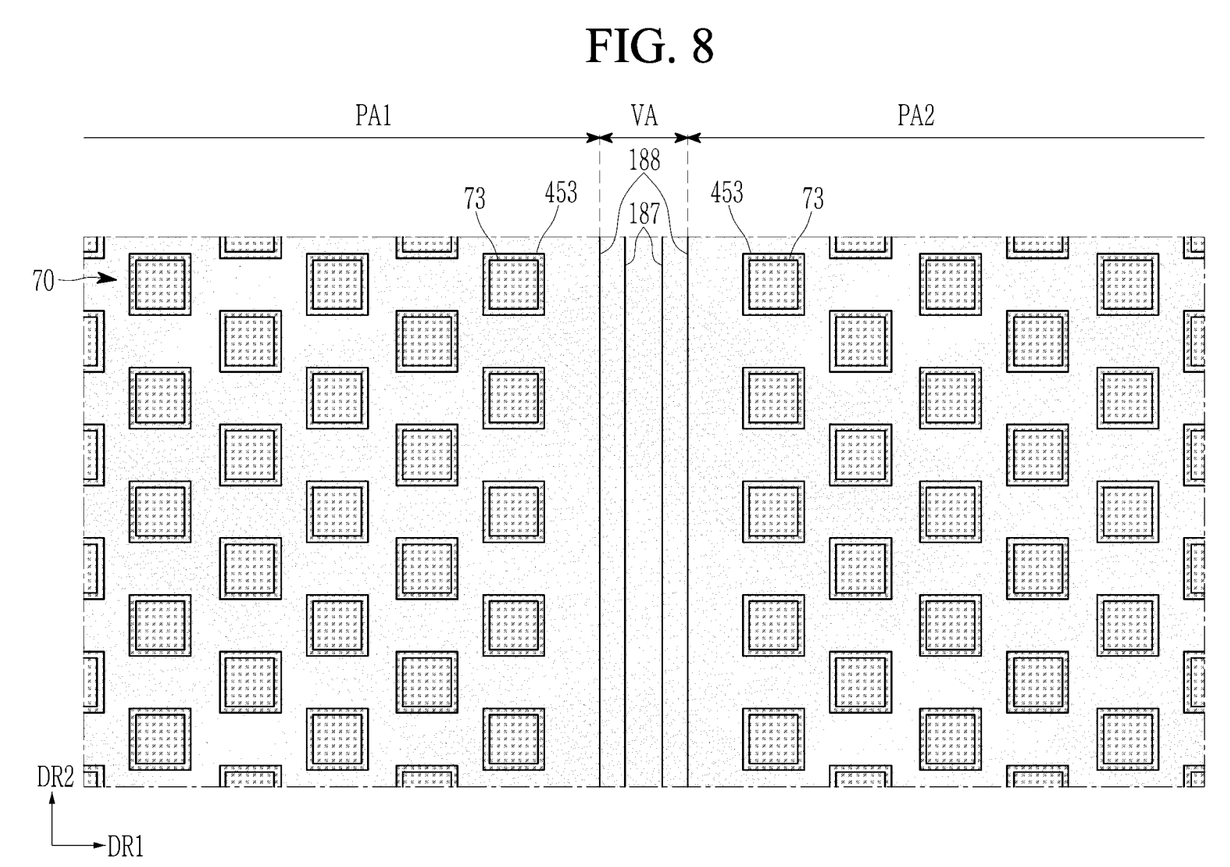
FIG. 8 and FIG. 9 are schematic plan views showing a display device according to a reference example.
Figure 9:
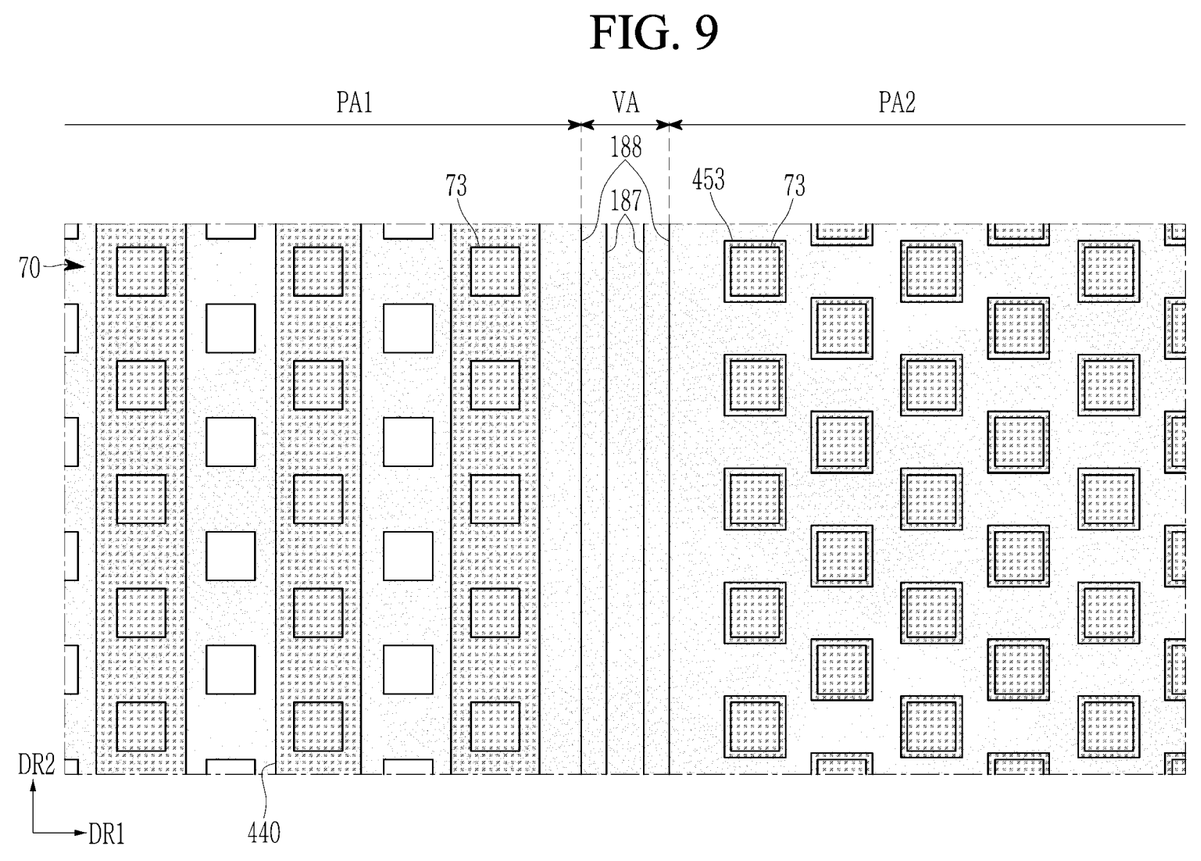

Hereinafter, a display device according to a reference example and a display device according to an embodiment are compared and described.

FIGS. 8 and 9 are schematic plan views illustrating a display device according to a reference example.

As shown in FIG. 8, a display device according to a reference example may include a common voltage supply line 70 disposed in a peripheral area PA of a substrate 110. The common voltage supply line 70 may include openings 73. The openings 73 may be disposed in a zigzag shape. For example, the openings 73 may be disposed to be adjacent to each other in a diagonal direction. The openings 73 may be positioned in the first peripheral area PA1 and the second peripheral area PA2. The opening 73 positioned in the first peripheral area PA1 and the opening 73 positioned in the second peripheral area PA2 may have substantially a same size and may have substantially a same arrangement.

Above the common voltage supply line 70, a protection pattern 453 may be positioned. The protection pattern 453 may overlap the opening 73 of the common voltage supply line 70. The protection pattern 453 may be formed to overlap the opening 73 of the common voltage supply line 70 and the surroundings thereof. Protection patterns 453 may be spaced apart from each other by a predetermined interval and may be disposed in a zigzag shape. The protection patterns 453 may be disposed to be adjacent to each other in a diagonal direction. The protection pattern 453 may be positioned in the first peripheral area PA1 and the second peripheral area PA2. The protection pattern 453 positioned in the first peripheral area PA1 and the protection pattern 453 positioned in the second peripheral area PA2 may have substantially a same size and may have substantially a same arrangement.

According to the display device according to the reference example shown in FIG. 8, in the process of forming an encapsulation layer by the protection patterns 453 that are uniformly disposed, a liquid organic material may be spread evenly. However, since there is no member blocking the liquid organic material, the liquid organic material may reach the edge of the substrate.

As shown in FIG. 9, the display device according to the reference example may include a common voltage supply line 70 positioned in the peripheral area PA of the substrate 110, and the common voltage supply line 70 may include openings 73 disposed in a zigzag shape. The opening 73 positioned in the first peripheral area PA1 and the opening 73 positioned in the second peripheral area PA2 may have substantially a same size and may have substantially a same arrangement.

A dam 440 and a protection pattern 453 may be positioned on the common voltage supply line 70. The dam 440 may be positioned in the first peripheral area PA1, and the protection pattern 453 may be positioned in the second peripheral area PA2. The dam 440 may be disposed in a direction. Two dams 440 can be disposed so that they are spaced apart from each other by a predetermined interval. The dam 440 may overlap some of the openings 73 positioned in the first peripheral area PA1 and may not overlap other openings 73. The protection pattern 453 may be formed to overlap the openings 73 positioned in the second peripheral area PA2.

According to the display device according to the reference example shown in FIG. 9, in the process of forming the encapsulation layer by the dam 440 positioned in the first peripheral area PA1, the liquid organic material may be blocked in the first peripheral area PA1. However, since some of the openings 73 located in the first peripheral area PA1 are not overlapped by the dam 440, the side of the common voltage supply line 70 may be exposed and damaged.

In the display device according to an embodiment, the first opening 71 positioned in the first peripheral area PA1 and the second opening 72 positioned in the second peripheral area PA2 may be designed to have different sizes and/or different arrangements, and thus a problem with the display device according to the reference example shown in FIGS. 8 and 9 may be solved. In the display device according to an embodiment, the side of the common voltage supply line 70 exposed by the first opening 71 may be protected by making the first opening 71 positioned in the first peripheral area PA1 overlap the dam 400. The interval between first openings 71 may be made dense in order to maximize the area of the first opening 71 positioned in the first peripheral area PA1. Therefore, by allowing the gas generated in the first peripheral area PA1 to be smoothly discharged through the first opening 71, the characteristics of the device may be improved. The second opening 72 positioned in the second peripheral area PA2 may be uniformly displaced in a zigzag shape as a whole, thereby maximizing the area of the second opening 72 positioned in the second peripheral area PA2. Therefore, by allowing the gas generated in the second peripheral area PA2 to be smoothly discharged through the second opening 72, the characteristic of the device can be improved. The protection patterns 453 may be formed in a zigzag shape to be electrically connected to each other in a diagonal direction in the second peripheral area PA2 to overlap the second opening 72, and thus the side of the common voltage supply line 70 exposed by the second opening 72 may be protected, and the liquid organic material may be spread evenly in the process of forming the encapsulation layer.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A display device comprising:
a substrate including:
a display area;
a first peripheral area disposed outside the display area; and
a second peripheral area disposed between the display area and the first peripheral area;
a common voltage supply line disposed on the first peripheral area and the second peripheral area of the substrate; and
a common electrode electrically connected to the common voltage supply line, wherein
the common voltage supply line includes:
at least one first opening disposed in the first peripheral area; and
at least one second opening disposed in the second peripheral area, and
the at least one first opening and the at least one second opening are different in size or arrangement.

2. The display device of claim 1, wherein
the at least one first opening includes a plurality of first openings formed in a plurality of columns, and
the at least one second opening includes a plurality of second openings formed in a zigzag shape.

3. The display device of claim 2, wherein a size of the at least one second opening is larger than a size of the at least one first opening.

4. The display device of claim 2, wherein
the plurality of columns are separated in a first direction, and
the plurality of first openings are separated in a second direction in each of the plurality of columns.

5. The display device of claim 4, wherein
the plurality of first openings are separated by a first interval in the second direction,
the plurality of first openings is separated by a second interval in the first direction, and
the second interval is greater than the first interval.

6. The display device of claim 5, wherein
the at least one first opening has a square shape, and
a length of a side of the at least one first opening is greater than the first interval and less than the second interval.

7. The display device of claim 5, wherein the plurality of second openings are disposed to be adjacent in a diagonal direction that is different from the first direction and the second direction.

8. The display device of claim 7, wherein
the plurality of second openings are separated in the diagonal direction by a third interval, and
the third interval is greater than the first interval and smaller than the second interval.

9. The display device of claim 8, wherein
the at least one second opening has a square shape, and
a length of a side of the at least one second opening is greater than the third interval.

10. The display device of claim 1, wherein a size of the at least one second opening is larger than a size of the at least one first opening.

11. The display device of claim 10, wherein the at least one first opening and the at least one second opening have one or more polygon shapes or one or more circle shapes.

12. The display device of claim 11, wherein
the at least one first opening and the at least one second opening have one or more square shapes, and
a length of a side of the at least one second opening is greater than a length of a side of the at least one first opening.

13. The display device of claim 1, further comprising a passivation layer disposed between the substrate and the common voltage supply line, wherein the passivation layer includes an organic material.

14. The display device of claim 13, further comprising
at least one dam; and
a protection pattern, wherein
the at least one dam and the protection pattern are disposed on the passivation layer and the common voltage supply line,
the at least one dam is disposed in the first peripheral area, and
the protection pattern is disposed in the second peripheral area.

15. The display device of claim 14, wherein
the at least one dam overlaps the at least one first opening,
the at least one dam includes a plurality of dams separated in a plurality of columns, and
the protection pattern overlaps the at least one second opening and has a zigzag shape.

16. The display device of claim 15, wherein
the at least one dam overlaps a side of the common voltage supply line within the at least one first opening, and
the protection pattern overlaps a side of the common voltage supply line within the at least one second opening.

17. The display device of claim 14, further comprising:
a transistor disposed on the display area of the substrate;
a pixel electrode electrically connected to the transistor;
a partition wall disposed on the pixel electrode, the partition wall including a third opening; and
a light-emitting element layer disposed within the third opening, wherein
the at least one dam, the protection pattern, and the partition wall are disposed on a same layer, and
the common voltage supply line and the pixel electrode are disposed on a same layer.

18. The display device of claim 17, wherein the common electrode is disposed on the at least one dam, the protection pattern, the partition wall, and the light-emitting element layer.

19. The display device of claim 18, further comprising an encapsulation layer disposed on the common electrode, wherein the encapsulation layer includes:
a first encapsulation inorganic layer;
an encapsulation organic layer; and
a second encapsulation inorganic layer.

20. The display device of claim 13, wherein
the substrate further includes a valley area disposed between the first peripheral area and the second peripheral area,
the passivation layer includes a fourth opening disposed in the valley area, and
a part of the passivation layer disposed in the first peripheral area and a part of the passivation disposed in the second peripheral area are separated by the fourth opening.

21. The display device of claim 20, wherein
the common voltage supply line contacts a side of the passivation layer within the fourth opening.

* * * * *